United States Patent [19]

Shirai et al.

[11] Patent Number: 5,683,857
[45] Date of Patent: Nov. 4, 1997

[54] METHOD FOR FORMING RESIST PATTERN BY IRRADIATING A RESIST COATING ON A SUBSTRATE, CONTACTING THE RESIST WITH ORGANIC SOLVENT VAPOR AND REMOVING THE IRRADIATED PORTION

[75] Inventors: Masamitsu Shirai, Ibaraki; Masahiro Tsunooka, Sennan; Kanji Nishijima, Ibaraki, all of Japan

[73] Assignee: Nippon Paint Co., Ltd., Osaka, Japan

[21] Appl. No.: 686,921

[22] Filed: Aug. 1, 1996

Related U.S. Application Data

[63] Continuation of Ser. No. 248,203, May 24, 1994, abandoned.

[30] Foreign Application Priority Data

May 24, 1993 [JP] Japan ................... 5-159902

[51] Int. Cl.$^6$ ................... G03C 5/16; B44C 1/22
[52] U.S. Cl. ................... 430/326; 430/311; 156/643.1
[58] Field of Search ................... 430/270.1, 326, 430/311; 156/643.1

[56] References Cited

U.S. PATENT DOCUMENTS

| | | | |
|---|---|---|---|
| 5,068,169 | 11/1991 | Takechi et al. | 430/326 X |
| 5,108,875 | 4/1992 | Thackeray et al. | 430/326 |
| 5,286,595 | 2/1994 | Hertler et al. | 430/270 X |
| 5,326,670 | 7/1994 | Kotachi et al. | 430/326 X |
| 5,346,803 | 9/1994 | Crivello et al. | 430/270 |
| 5,391,441 | 2/1995 | Imai et al. | 430/5 |

FOREIGN PATENT DOCUMENTS 4-69662  3/1992  Japan .

OTHER PUBLICATIONS

Yamaoka et al., Polymer Engineering and Science, vol. 29, No. 13, "A Novel Positive Resist for Deep UV Lithography", Mid–Jul., 1992, pp. 856–858.

Aoai et al., J. Photopolym. Sci. Technol., vol. 3, No. 3, "Application of Silyether and Silylester Polymer for Chemical Amplification System", 1990, pp. 389–400.

*Primary Examiner*—George F. Lesmes
*Assistant Examiner*—Bernard P. Codd
*Attorney, Agent, or Firm*—Wenderoth, Lind & Ponack

[57] ABSTRACT

A method for forming a resist pattern which comprises irradiating an active light ray to a resist obtained by coating a photosensitive resin composition containing a compound capable of generating an acid due to irradiation of the active light ray and a silyloxy compound in a binder resin on a substrate through a pattern mask to decompose the silyloxy compound due to the acid generated at the irradiation region to form a silanol compound, and after removing the silanol compound, removing a film at the photosensitive region due to an oxygen plasma, a removal of said silanol compound being conducted by bringing the film after irradiation of the active light ray into contact with volatile organic solvent vapor having a boiling photosensitive composition.

3 Claims, No Drawings

METHOD FOR FORMING RESIST PATTERN BY IRRADIATING A RESIST COATING ON A SUBSTRATE, CONTACTING THE RESIST WITH ORGANIC SOLVENT VAPOR AND REMOVING THE IRRADIATED PORTION

This application is a continuation of now abandoned application, Ser. No. 08/248,203, filed May 24, 1994 now abandoned.

FIELD OF THE INVENTION

The present invention relates to a method for forming a fine resist pattern. More particularly, it relates to a method for forming a fine resist pattern of a submicron order, which is applicable to the production of electronic circuit elements having a fine pattern such as a semi-conductor element, a magnetic bubble memory element, etc.

BACKGROUND OF THE INVENTION

In production of electronic circuit elements having a fine pattern such as a semi-conductor element, a magnetic bubble memory element, etc., there has been known a method which comprises applying a photosensitive film on a surface of a substrate to be processed by a spin-coating method, etc. and irradiating an active light ray to the photosensitive film through a pattern mask to form a resist pattern by utilizing the difference in the solubility of an exposed part to a developer. However, studies have been made to employ a dry development by anisotropic oxygen plasma suitable for forming a fine pattern in the developing process of a fine pattern. In order to obtain a resist pattern having good resolution by the treatment using the dry development, it is important to select a photosensitive material which shows large difference between dry development resistance of a portion remaining after development and the brittleness of a portion removing during development.

For example, there is disclosed in Japanese Laid-Open Patent Publication No. 2-127645 a method which comprises substituting an active hydrogen of a novolak resin with a functional group containing a silicon atom as a comparatively large atom (e.g. —Si—(CH$_3$)$_3$) to obtain a resist pattern having good dry development resistance by a selective silylation method. Concretely, a fine pattern may be obtained by applying a photosensitive resin containing an aromatic ring structure having a phenolic hydroxyl group in a molecule on a substrate, irradiating active light rays in different wavelengths at two stages to form a coating having a contrast between dry development resistance and brittleness by silylation to the photosensitive surface with a hexamethyldisilazane vapor, followed by dry development.

Japanese Laid-Open Patent Publication No. 63-231330 also discloses a method which produces a fine pattern using a two-layer structure-positive type resist having high sensitivity and excellent dry development resistance. In Japanese Laid-Open Patent Publication No. 63-231330, a photosensitive resist plate is prepared by applying an organic resin as the first layer on a substrate, and then applying a positive type resist comprising an alkali-soluble silicone modified resin, a partial ladder type silicone resin and a quinonediazide compound for the second layer thereon. By using the resist plate, a fine pattern is obtained by exposing the resist plate to an active light ray through a positive film, and developing the resist of the second layer with an alkali developer, followed by the dry development of the organic resin of the first layer.

Recently, Japanese Laid-Open Patent Publication No 4-69662 discloses a method which comprises volatilizing a silyloxy group or a silylamino group dissociated with an acid by heat treatment, followed by the dry development with an oxygen plasma to obtain a fine pattern. Concretely, a desired resist pattern may be obtained by irradiating an active light ray to a resist containing a silyloxy compound and/or a silylamino compound and a photoacid generator, subjecting it to heat treatment and removing the resist at the part irradiated by the active light ray by oxygen plasma.

However, in the selective silylation method, the silylation reaction at the part to be silylated is not sufficient so that the silylation selectivity at the exposed and non-exposed parts is not sufficient. Therefore, the dry development resistance at the non-exposed part is not sufficient and it is disadvantageous to obtain a fine pattern.

Further, even if a contrast of the silylation is afforded by a two-stage exposure of active light rays having different wavelengths, the silylation itself is not sufficient and the exposure process requiring a two-stage exposure is complicated. In a method using a two-layer structure-positive type resist, it is not sufficient in view of the complexity of two-stage application of resist and dry development resistance.

In a method comprising volatilizing a silyloxy group or a silylamino group by a heat treatment to obtain a resist pattern, the heating condition is suitably selected by the kind of the resist. The heating condition is restricted by a change in the properties of the coated photosensitive membrane due to heat, e.g. decomposition of the silyloxy group, decomposition of the photoacid generator and the like. The heating condition is also restricted so as to inhibit a change in shape of the pattern due to fusion after exposure of the pattern. Therefore, it is not sufficient to completely volatilize the silyloxy group and the silylamino group and is not sufficient in view of the dry developing treatment.

SUMMARY OF THE INVENTION

Under these circumstances, the present inventors have intensively studied about various materials in order to form a resist coating superior in the dry developing treatment. As a result, it has been found that, when a resin composition containing a compound capable of generating an acid upon irradiation of an active light ray and a silyloxy compound is applied on a substrate and an active light ray is irradiated onto the resulting photosensitive membrane through a pattern mask, the silyloxy group is dissociated with the acid generated in the irradiated part. Then, by using a solvent vapor in contact with the photosensitive membrane, the dissociation is accelerated and the silyloxy group can be evaporated and removed as alkylsilanol by the reaction with water in the resin composition.

As described above, the silyloxy group disappears in the irradiated portion of the resin composition, and it can be easily removed by the dry developing treatment using an oxygen plasma. On the other hand, the silyloxy group is present in the resin composition in the non-irradiated portion, which results in a resist pattern having high dry developing resistance. Thus, a fine resist pattern can be obtained.

That is, the main object of the present invention is to provide a method for forming a resist coat superior in a dry developing treatment, whereby a fine pattern can be formed in a simple process.

The present invention provides a method for forming a resist pattern which comprises:

irradiating an active light ray through a pattern mask to a resist obtained by coating a photosensitive resin composition containing a compound capable of generating an acid due to the irradiation of the active light ray and a silyloxy compound in a binder resin on a substrate to decompose the silyloxy compound with the acid generated at the irradiation region to form a silanol compound, and after removing the silanol compound, removing a film at the photosensitive region by oxygen plasma, wherein the removal of said silanol compound being conducted by bringing the film after irradiation of the active light ray into contact with volatile organic solvent vapor having a boiling point of not more than 150° C.

DETAILED DESCRIPTION OF THE INVENTION

As the compound of generating the acid due to irradiation of the active light ray in the present invention, there can be used various compounds. Examples thereof include photosensitive resin compositions having an iminosulfonate group disclosed by the present inventors in Japanese Laid-Open Patent Publication No. 1-163736, various tosylate compounds having o-nitrobenzyl group described in F. M. Houlihan, A. Shugard, R. Gooden, and E. Reichmanis, Macromoleculues, 21, (1988), 2001 or onium salts used as a cationic photopolymerization initiator or a chemical amplification type acid generator.

The photosensitive acrylic resin described in Japanese Laid-Open Patent Publication No. 1-163736 is an acrylic resin having at least one iminosulfonate group represented by the following formula:

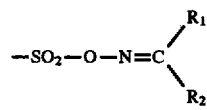

(wherein $R_1$ and $R_2$ are the same or different and respectively indicate a hydrogen atom, an alkyl group, an acyl group, a phenyl group, a naphthyl group, an anthryl group or a benzyl group, or $R_1$ and $R_2$ may bond together with the carbon atom to which they are attached to form an alicyclic ring) in a side chain or a main chain-terminal. Further, it may not be an acrylic resin, but an iminosulfonate compound such as fluorenoneoxime-p-toluenesulfonate, tetraloneoxime-p-toluenesulfonate, etc.

Examples of the tosyl compound include 2-nitrobenzyl tosylate, 2,4-dinitrobenzyl tosylate, 2,6-dinitrobenzyl tosylate and the like. Examples of the onium salt include diazonium, phosphonium, sulfonium and iodonium salts of $BF_4-$, $PF_6-$, $SbF_6-$, $SiF_6-$, etc., (3-nitrophenyl)phenyliodonium tetrafluoroborate represented by

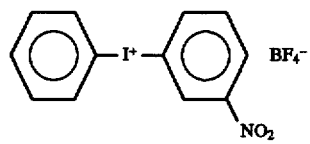

di(4-methylphenyl)iodonium tetrafluoroborate represented by

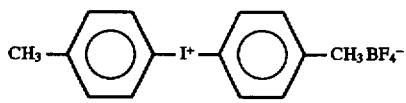

1-(benzoylmethyl)pyridinium tetrafluoroborate represented by

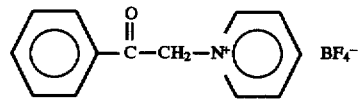

(4-phenylthiophenyl)diphenylsulfonium hexafluorophosphate represented by

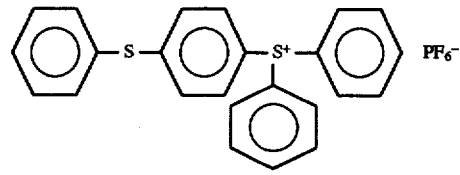

benzoylmethyltriphenylphosphonium hexafluorophosphate represented by

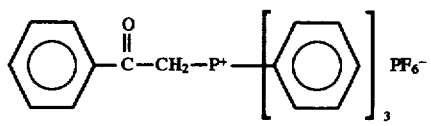

di(4-chlorophenyl)iodonium hexafluorophosphate represented by

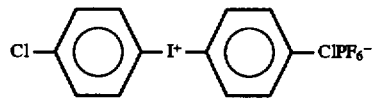

4-chlorobenzenediazonium hexafluorophosphate represented by

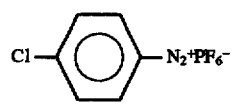

(4-methoxyphenyl)phenyliodonium hexafluoroantimonate represented by

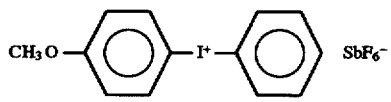

(3-benzoylphenyl)phenyliodonium hexafluoroantimonate

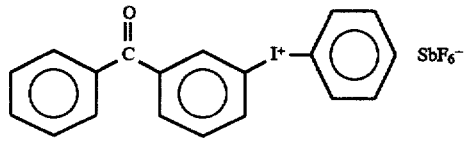

triphenylsulfonium hexafluoroarsenate represented by

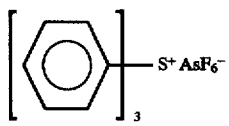

diphenyliodonium hexafluoroarsenate represented by

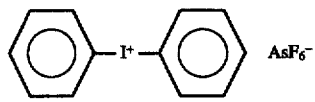

and the like.

The above-mentioned acrylic resin having the iminosulfonate group can be used as it is as the resin composition. Further, when the acrylic resin is considered to be the compound capable of generating the acid due to irradiation of the active light ray, it is formulated in a suitable binder resin, similar to the other tosylate or onium salts, to prepare a photosensitive composition is then applied on a substrate by a normal method. Examples of the binder resin include any resin used for paint, such as acrylic resin, epoxy resin, polybutadiene resin, polyester resin, and the like.

As the compound capable of generating the acid due to irradiation of the active light ray, a compound generating a strong acid after exposure is preferred in view of the purpose of the present invention. A uniform resin solution can be prepared from the above compound so as to apply the resin solution easily on the substrate, and the compound contains no toxic metal. For example, a compound having an iminosulfonate group is particularly preferred.

Examples of the silyloxy compound used in the present invention include polymers or copolymers having at least one sort of a repeating unit represented by the formula:

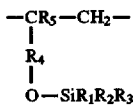

(wherein $R_1$, $R_2$ and $R_3$ respectively indicate a hydrogen atom, an alkyl group having 1 to 4 carbon atoms and a phenyl group; $R_4$ is a phenyl group, a carbonyl group and an aliphatic alkylester group having 1 to 4 carbon atoms; and $R_5$ is a hydrogen atom and a methyl group) having a silyloxy group represented by the formula: $—O—SiR_1R_2R_3$ (wherein $R_1$, $R_2$ and $R_3$ respectively indicate a hydrogen atom, an alkyl group having 1 to 4 carbon atoms and a phenyl group).

Such a compound is disclosed in Japanese Laid-Open Patent Publication No. 4-69662 and is also described in T. Yamaoka, N. Nishiki, K. Koseki, M. Koshiba, Polym. Eng. Sci., 29, 856 (1981) and T. Aoai, T. Aotani, A. Umehara, T. Kokubo, J. Photopolym. Sci. Technol., 3, No. 3, 389 (1990).

The silyloxy compound including the above-mentioned repeating unit may contain other repeating unit of polymerizable monomers, e.g. acrylic monomers such as methyl methacrylate, ethyl methacrylate, methacrylic acid, etc.; styrene monomers such as styrene, α-methylstyrene, etc.

Additional examples of the silyloxy compound include compounds having one or more repeating units represented by the formula:

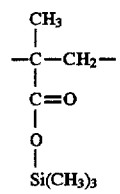

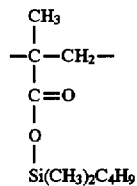

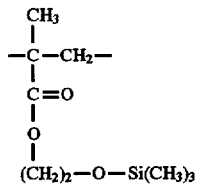

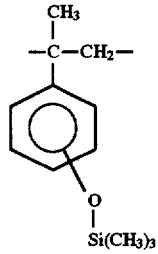

or

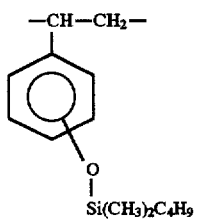

As the solvent vapor, there can be used vapor of various organic solvent. Examples thereof include vapor of solvents, e.g. alcohols such as methanol, ethanol, n-propanol, isopropanol, n-butanol, t-butanol, ethoxyethanol, diethylene glycol monoethyl ether, etc.; esters such as ethyl acetate, butyl acetate, cellosolve acetate, etc.; ketones such as acetone, methyl ethyl ketone, methyl isobutyl ketone, cyclohexanone, etc.; ethers such as ethyl ether, isopropyl ether, tetrahydrofuran, dioxane, etc.; aliphatic hydrocarbons such as n-pentane, n-hexane, cyclohexane, etc.

In order to remove the silyloxy group dissociated with the acid from the resin composition, low molecular weight solvents having high volatility are particularly preferred. More concretely, solvents having a boiling point of not more than 150° C., e.g. acetone, methanol, ethanol, n-propanol, methyl ethyl ketone, n-hexane and the like are preferred.

The treatment with vapor of the above solvent can be conducted only by bringing the film after irradiation of the light ray into contact with said vapor, and a particular equipment is not required. For example, it can be advantageously conducted by holding the resist in a closed chamber and introducing the solvent into the upper of the chamber as a droplet under reduced pressure or introducing solvent vapor together with an air flow into the chamber. The contact time between solvent vapor and the resist is suitably selected according to the selection of each material and degree of solvent etching, and it is sufficient for about several minutes.

As described above, in the present invention, the silanol compound is effectively removed by solvent vapor, then the dry developing treatment due to the oxygen plasma is conducted. In comparison with a removal of the silanol compound due to a conventional heat treatment, it is possible to treat the resist at room temperature in the present invention. Therefore, not only conventional various disadvantages accompanied with heating are solved, but a faithful circuit style of a fine pattern can be obtained, which is a very important invention industrially.

EXAMPLES

The following Synthesis Examples and Examples further illustrate the present invention in detail but are not to be construed to limit the scope thereof. In the Synthesis Examples and Examples, "parts" and "%'s" are by weight unless otherwise stated.

Synthesis Example 1

Dioxane (150 parts) was added to a 1 liter separable flask and heated to 70° C. A mixed solution of styrene (100 parts), trimethylsilyl methacrylate (160 parts) and azobisisobutyronitrile (5 parts) was added dropwise over 8 hours. After 30 minutes, a mixed solution of dioxane (50 parts) and azobisisobutyronitrile (1 part) was added dropwise over 30 minutes and the reaction was conducted at the same temperature for one hour to give a silyloxy compound (A) containing a solid content of 55.8%.

Synthesis Example 2

Dioxane (150 parts) was added to a 1 liter separable flask and heated to 90° C. A mixed solution of methyl methacrylate (150 parts), p-trimethylsilyloxystyrene (100 parts) and azobisisobutyronitrile (8 parts) was added dropwise over 6 hours. After 30 minutes, a mixed solution of dioxane (50 parts) and azobisisobutyronitrile (1 part) was added dropwise over 30 minutes and the reaction was conducted at the same temperature for one hour to give a silyloxy compound (B) containing a solid content of 54.5%.

Synthesis Example 3

Dioxane (150 parts) was added to a 1 I liter separable flask and heated to 90° C. A mixed solution of methyl methacrylate (100 parts), p-dimethylbutylsilyloxystyrene (150 parts) and azobisisobutyronitrile (5 parts) was added dropwise over 5 hours. After 30 minutes, a mixed solution of dioxane (50 parts) and azobisisobutyronitrile (1 part) was added dropwise over 30 minutes and the reaction was conducted at the same temperature for one hour to give a silyloxy compound (C) containing a solid content of 54.8%.

Synthesis Example 4

Dioxane (200 parts) was added to a 1 liter separable flask and heated to 80° C. A mixed solution of styrene (50 parts), dimethylbutylsilyl methacrylate (250 parts) and azobisisobutyronitrile (5 parts) was added dropwise over 8 hours. After 30 minutes, a mixed solution of dioxane (50 parts) and azobisisobutyronitrile (1 part) was added dropwise over 30 minutes and the reaction was conducted at the same temperature for one hour to give a silyloxy compound (D) containing a solid content of 54.0%.

Synthesis Example 5

Ethylene glycol monobutyl ether (100 parts) was added to a 1 liter separable flask and heated to 120° C. A mixed solution of methyl methacrylate (150 parts), fluorenoneoxime-p-styrenesulfonate (60 parts) and azobisisobutyronitrile (8 parts) was added dropwise over 4 hours. After 30 minutes, a mixed solution of ethylene glycol monobutyl ether (100 parts) and azobisisobutyronitrile (1 part) was added dropwise over 30 minutes and the reaction was conducted at the same temperature for one hour to give a compound (E) having an iminosulfonyl group, which contains a solid content of 50.1%.

Example 1

The silyloxy compound (A) (50 parts) obtained in Synthesis Example 1 and tetraloneoxime-p-toluenesulfonate (8 parts) were dissolved in methyl ethyl ketone (180 parts) and the resulting solution was filtered through a milipore filter (pore diameter: 0.2 µm) to prepare a photosensitive solution. The photosensitive solution thus prepared was applied on a substrate using a spinner and dried in an oven at 100° C. for 10 minutes to obtain a photosensitive membrane having a thickness of 1.0 µm.

Then, the membrane was exposed to a low-pressure mercury vapor lamp of which light intensity is 10 mW/cm$^2$ at 254 nm through a pattern mask for about 50 seconds. Thereafter, methanol vapor was contacted with the whole surface of the substrate for about 5 minutes and subjected to a dry development due to an oxygen plasma at an oxygen pressure of 0.5 torr, at a plasma output of 140 W for 5 minutes to obtain a fine resist pattern of 0.8 µm.

Example 2

The silyloxy compound (B) (50 parts) obtained in Synthesis Example 2 and an iminosulfonate compound (E) (20 parts) obtained in Synthesis Example 5 were dissolved in methyl ethyl ketone (180 parts) and the resulting solution was filtered through a millpore filter (bore diameter: 0.2 µm) to prepare a photosensitive solution. The photosensitive solution thus prepared was applied on a substrate using a spinner and dried in a oven at 100° C. for 10 minutes to obtain a photosensitive membrane having a thickness of 1.1 µm.

Then, the membrane was exposed to a high-pressure mercury vapor lamp of which light intensity is 5 mW/cm$^2$ at 365 nm through a pattern mask for 60 seconds. Thereafter, acetone vapor was contacted with the whole surface of the substrate for about 5 minutes and subjected to a dry development due to an oxygen plasma at an oxygen pressure of 0.5 torr, at a plasma output of 140 W for 5 minutes to obtain a fine resist pattern of 0.7 µm.

Example 3

The silyloxy compound (C) (50 parts) obtained in Synthesis Example 3 and triphenylsulfonium hexafuluoroarsenate (10 parts) were dissolved in methyl ethyl ketone (180 parts) and the resulting solution was filtered through a milipore filter (bore diameter: 0.2 µm) to prepare a photosensitive solution. The photosensitive solution thus prepared was applied on a substrate using a spinner and dried in a oven at 100° C. for 10 minutes to obtain a photosensitive membrane having a thickness of 1.0 µm.

Then, the membrane was exposed to a low-pressure mercury vapor lamp of which light intensity is 10 mW/cm$^2$ at 245 nm through a pattern mask for about 50 seconds.

Thereafter, n-hexane vapor was contacted with the whole surface of the substrate for about 5 minutes and subjected to a dry development due to an oxygen plasma at an oxygen pressure of 0.5 torr, at a plasma output of 140 W for 5 minutes to obtain a fine resist pattern of 0.9 μm.

Example 4

The silyloxy compound (D) (50 parts) obtained in Synthesis Example 4 and 2-nitrobenzyl tosylate (5 parts) were dissolved in methyl ethyl ketone (160 parts) and the resulting solution was filtered through a milipore filter (bore diameter: 0.2 μm) to prepare a photosensitive solution. The photosensitive solution thus prepared was applied on a substrate using a spinner and dried in a oven at 100° C. for 10 minutes to obtain a photosensitive membrane having a thickness of 1.0 μm.

Then, the membrane was exposed to a low-pressure mercury vapor lamp of which light intensity is 10 mW/cm$^2$ at 254 nm through a pattern mask for about 50 seconds. Thereafter, ethanol vapor was contacted with the whole surface of the substrate for about 5 minutes and subjected to a dry development due to an oxygen plasma at an oxygen pressure of 0.5 torr, at a plasma output of 140 W for 5 minutes to obtain a fine resist pattern of 0.9 μm.

What is claimed is:

1. A method for forming a resist pattern consisting essentially of:
   (i) preparing a resist by coating on a substrate a photosensitive resin composition as a single layer, the composition consisting essentially of:
      (a) a polymer having one or more silyloxy groups,
      (b) a compound or polymer capable of generating an acid due to irradiation of an active light ray, and
      (c) optionally a binder resin;
   (ii) irradiating said resist with an active light ray through a pattern mask and letting said silyloxy groups dissociate from the polymer (a) to form silanol compounds;
   (iii) bringing the resist into contact with volatile organic solvent vapor formed from a solvent having a boiling point of not more than 150° C. to remove said silanol compounds on an irradiated portion, resulting in making the irradiated portion removable by oxygen plasma, and
   (iv) subjecting said resist to oxygen plasma to remove the irradiated portion.

2. The method according to claim 1, wherein said volatile organic solvent vapor is the vapor of a low molecular weight volatile solvent selected from the group consisting of an alcohol, an ester, a ketone, an ether, and an aliphatic hydrocarbon solvent.

3. The method according to claim 2, wherein the solvent is selected from the group consisting of acetone, methanol, n-propanol, methyl ethyl ketone and n-hexane.

* * * * *